(12) United States Patent
Nishikawa et al.

(10) Patent No.: US 12,302,687 B2
(45) Date of Patent: May 13, 2025

(54) LIGHT-EMITTING ELEMENT AND DISPLAY DEVICE WITH INSULATING LAYER THAT INCLUDES EAVES

(71) Applicant: Sony Semiconductor Solutions Corporation, Kanagawa (JP)

(72) Inventors: Tomotaka Nishikawa, Aichi (JP); Kunihiko Hikichi, Kumamoto (JP); Yuuki Sakai, Kumamoto (JP); Tsutomu Shimayama, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 479 days.

(21) Appl. No.: 17/770,401

(22) PCT Filed: Oct. 16, 2020

(86) PCT No.: PCT/JP2020/039057
§ 371 (c)(1),
(2) Date: Apr. 20, 2022

(87) PCT Pub. No.: WO2021/085176
PCT Pub. Date: May 6, 2021

(65) Prior Publication Data
US 2022/0393132 A1  Dec. 8, 2022

(30) Foreign Application Priority Data
Oct. 30, 2019  (JP) .................................. 2019-197494

(51) Int. Cl.
*H10K 50/19*  (2023.01)
*H10K 50/813*  (2023.01)
(Continued)

(52) U.S. Cl.
CPC .......... *H10K 50/19* (2023.02); *H10K 50/813* (2023.02); *H10K 50/82* (2023.02); *H10K 59/38* (2023.02)

(58) Field of Classification Search
None
See application file for complete search history.

(56) References Cited

U.S. PATENT DOCUMENTS 6,069,443 A *  5/2000  Jones ................... H10K 50/841
                                                         313/506
6,828,727 B2 * 12/2004  Yamazaki ............ H10K 50/844
                                                         313/506
(Continued)

FOREIGN PATENT DOCUMENTS

CN  105280676 A     1/2016
CN  109216420 A *   1/2019 ......... H01L 27/1225
(Continued)

OTHER PUBLICATIONS

International Search Report (PCT/ISA/210), International Application No. PCT/JP2020/039057, dated Dec. 1, 2020.

*Primary Examiner* — Scott B Geyer
(74) *Attorney, Agent, or Firm* — Michael Best & Friedrich LLP

(57) ABSTRACT

A light-emitting element and a display device capable of improving the light emission property are provided. Each of a plurality of anode electrodes (11) is provided for a corresponding pixel. The pixel-isolating insulation film (12) has an opening (120) exposing corresponding one of the plurality of anode electrodes (11) to outside, and has an eave (123B) in the middle of a thickness direction of an inner wall of the opening (120). An organic layer (13) includes a CGL (132) cut by the eave (123B) of the pixel-isolating insulation film (12), and covers the opening (120). A cathode electrode (14) is disposed on a surface of the organic layer (13), the (Continued)

surface being a surface on the opposite side of the anode electrode (11).

26 Claims, 11 Drawing Sheets

(51) Int. Cl.
*H10K 50/82* (2023.01)
*H10K 59/38* (2023.01)

(56) References Cited

U.S. PATENT DOCUMENTS

| | | | |
|---|---|---|---|
| 10,971,700 B2* | 4/2021 | Im | H10K 50/865 |
| 2013/0001620 A1 | 1/2013 | Sugisawa | |
| 2014/0103368 A1 | 4/2014 | Hatano | |
| 2015/0028315 A1* | 1/2015 | Nishimura | H10K 59/123 |
| | | | 438/46 |
| 2015/0048328 A1* | 2/2015 | Kato | H10K 59/80515 |
| | | | 438/34 |
| 2017/0309693 A1* | 10/2017 | Pang | H10K 50/131 |
| 2018/0122876 A1* | 5/2018 | Shim | H10K 59/131 |
| 2018/0145115 A1* | 5/2018 | Shimizu | H10K 50/15 |
| 2018/0190934 A1* | 7/2018 | Choi | H10K 59/80522 |
| 2018/0337221 A1* | 11/2018 | Zhu | H10K 71/00 |
| 2019/0172898 A1* | 6/2019 | Choi | H10K 50/813 |
| 2019/0181199 A1* | 6/2019 | Choi | H10K 59/124 |
| 2020/0135838 A1* | 4/2020 | Han | H10K 50/86 |
| 2020/0161397 A1* | 5/2020 | Pang | H10K 59/126 |
| 2020/0212119 A1* | 7/2020 | Shim | H10K 59/35 |
| 2021/0119183 A1* | 4/2021 | Lee | H10K 59/122 |

FOREIGN PATENT DOCUMENTS

| | | |
|---|---|---|
| EP | 2955766 B1 | 11/2021 |
| JP | 2003-186423 A | 7/2003 |
| JP | 2008-112658 A | 5/2008 |
| JP | 2011-165629 A | 8/2011 |
| JP | 2012-182120 A | 9/2012 |
| JP | 2012-182121 A | 9/2012 |
| JP | 2013-112694 A | 6/2013 |
| TW | 201301607 A | 1/2013 |

* cited by examiner

RELATED ART

LIGHT-EMITTING ELEMENT AND DISPLAY DEVICE WITH INSULATING LAYER THAT INCLUDES EAVES

FIELD

The present invention relates to a light-emitting element and a display device.

BACKGROUND

When an organic material having low resistance is used in an active organic: light-emitting diode (OLED) panel not applied with pixel printing, there have been some known problems of an organic layer leakage, which is a current leakage from between pixels via the organic material, and a device leakage from a part where the organic coating is defective. If such a current leakage occurs, when a specific pixel is illuminated, the current flows into the adjacent pixels, and causes the unintended pixels to emit light. As a result, defects such as a deterioration in color gamut, a color registration error, a deterioration in luminous efficiency, and contrast insufficiency may occur.

Known as a countermeasure for these problems is a structure in which a pixel-isolating insulation film is disposed in a manner cutting the low-resistance organic material between the pixels so that the pixels are insulated and isolated from one another.

CITATION LIST

Patent Literature

Patent Literature 1: JP 2013-112694 A

SUMMARY

Technical Problem

However, in the conventional technology in which the pixel-isolating insulation film is disposed, the coverage of the organic film, the cathode electrode film, and the protective film may become deteriorated and cause a deterioration in the light emission property.

Therefore, the present disclosure provides a light-emitting element and a display device capable of improving the light emission property.

Solution to Problem

According to the present disclosure, a plurality of first electrodes is provided for a corresponding pixel. An insulating layer has an opening exposing corresponding one of the plurality of first electrodes to outside, and has an eave in a middle of a thickness direction of an inner wall of the opening. An organic layer covers the opening, and includes a charge generation layer cut by the eave of the insulating layer. A second electrode is disposed on a surface of the organic layer, the surface being a surface on an opposite side of the first electrode.

DESCRIPTION OF EMBODIMENTS

Figure 1:
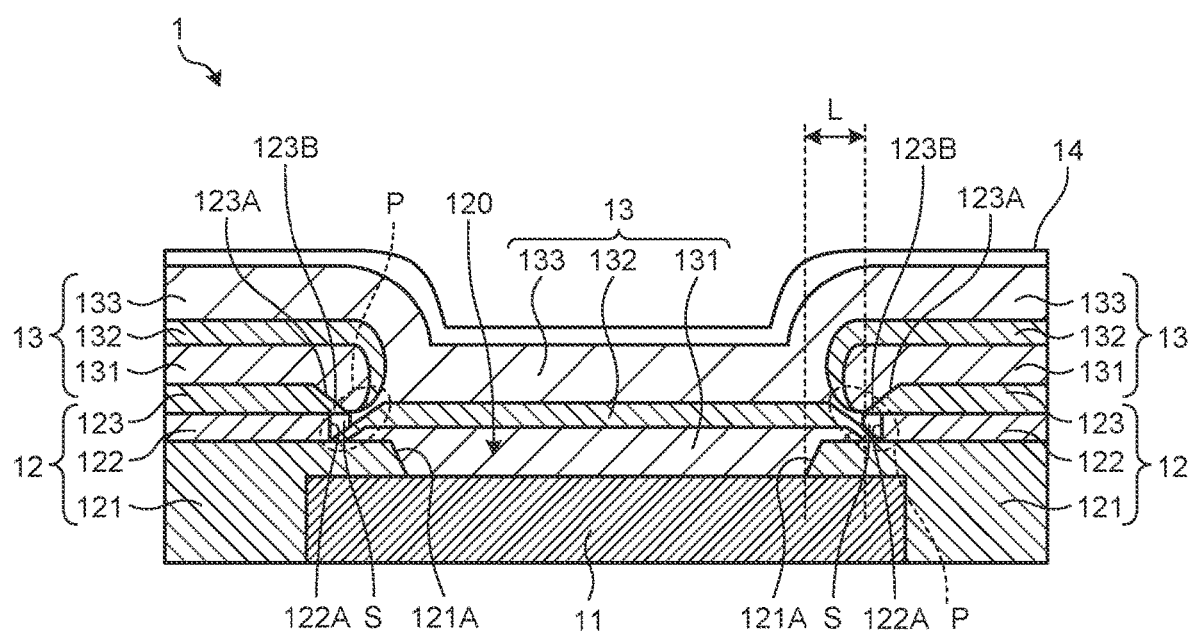
FIG. 1 a cross-sectional view of a light-emitting element according to a first embodiment.

Some embodiments according to the present disclosure will now be explained in detail with reference to some drawings. In the following embodiments, the same parts are given the same reference numerals, and redundant explanations will be omitted.

First Embodiment

Because an active OLED is high-definition, it is difficult to apply pixel printing. Therefore, an area film formation is performed in the organic vapor deposition With this method, a current leakage from between the adjacent pixels becomes a problem in the organic layer, in a part where the hole mobility is high. Main causes of the current leakage include a leakage in horizontal directions across the pixels in a layer with a high hole electron mobility in the organic layer, and a leakage in the vertical directions due to a voltage drop in a part where the layer has become thin due to a deterioration in the organic coating property.

Practiced as a countermeasure to this problem is disposing a pixel-isolating insulation film in a manner cutting the low-resistance organic material between the pixels. Also practiced is suppressing the leakage by providing a tapered shape to the anode portion of the pixel-isolating insulation film disposed between the pixels, and increasing the taper angle, so as to reduce the thickness of the layer with a high hole mobility, and to reduce the mobility thereby. A current leakage in the first layer HIL/HTL or the like is also blocked therewith However, with this technology, when the organic layer has an organic structure including a plurality of stacks, it is difficult to take the measures for the second stack and the stacks thereafter. In the organic structure having two or more stacks, even if the current leakage in the HIL/HTL or the like in the first layer is blocked, it is difficult to block the current leakage in the layer having a high hole electron mobility.

Furthermore, even when the organic layer has a one-stack organic structure, some limitation may be imposed on the design value of the film thickness of a layer with a high hole mobility, and therefore, it may become difficult to reduce the thickness of the organic layer sufficiently. When this is the case, it becomes difficult to suppress the current leakage in an organic layer with a high hole mobility, and the electrical property, the light emission property, the reliabilty, and the like may become deteriorated.

Configuration of Light-Emitting Element According to First Embodiment

FIG. 1 is a cross-sectional view of the light-emitting element according to the first embodiment. As illustrated in FIG. 1, a light-emitting element 1 according to this embodiment includes an anode electrode 11, a pixel-isolating insulation film 12, and an organic layer 13.

The anode electrode 11 is provided in a manner electrically isolated in units of a pixel, and also functions as a reflection layer, and therefore, it is preferable to have a reflectance as high as possible, from the viewpoint of improving the luminous efficiency. Because the anode electrode 11 is used as an anode, it is preferable for the anode electrode to be made of a material having a high hole injection property.

The thickness of the anode electrode 11 in the lamination direction (hereinafter, simply referred to as a thickness) is, for example, equal to or more than 30 nm and equal to or less than 1000 nm. The pitch of the anode electrodes 11 (the interval between the adjacent anode electrodes 11) is 200 nm to 1000 nm or so, for example. Examples of the material of the anode electrode 11 include one of or an alloy of metallic elements such as chromium (Cr), gold (Au), platinum (Pt), nickel (Ni), copper (Cu), molybdenum (Mo), tungsten (VI), titanium (Ti), tantalum (Ta), silver (Ag), and aluminum (Al). A transparent conductive film, such as that made of an indium tin oxide (ITO), may also be provided on the surface of the anode electrode 11. The thickness of the anode electrode 11 is set as appropriate, based on the balance between the wiring resistance and the reflectance (surface roughness). For what is called a bottom-emitting element (bottom-surface emitting element), the anode electrode 11 is provided as a transparent conductive film.

The pixel-isolating insulation film 12 electrically isolates the anode electrodes 11 between the pixels, and ensures the insulation between the anode electrode 11 and a cathode electrode 14 that is in contact with the organic layer 13. The pixel-isolating insulation film 12 is formed by laminating a lower insulating layer 121, an intermediate insulating layer 122, and an upper insulating layer 123. The pixel-isolating insulation film 12 corresponds to an example of an "insulating layer".

The lower insulating layer 121 has an opening through which a top surface of the anode electrode 11 (the surface facing the cathode electrode 14) is exposed to the outside, and is provided in a manner covering the periphery of the anode electrode 11 across the top surface to the side surface (end surface). The opening of the lower insulating layer 121 has a tapered inner wall 121A that extends in a direction from a surface facing the cathode electrode 14 toward the anode electrode 11, being tapered so that the opening becomes smaller toward the anode electrode 11.

The intermediate insulating layer 122 is laminated on a surface of the lower insulating layer 121, the surface being one that faces the cathode electrode 14. The intermediate insulating layer 122 is disposed separated from every point along the outer periphery of the opening of the lower insulating layer 121, by a certain distance. In other words, the intermediate insulating layer 122 has an opening the outer periphery of which is positioned away from the opening of the lower insulating layer 121 by a certain distance. An inner wall 122A of the opening of the intermediate insulating layer 122 according to this embodiment has a surface perpendicular to the anode electrode 11 in the thickness direction.

The upper insulating layer 123 is laminated on a surface of the intermediate insulating layer 122, the surface being one that faces the cathode electrode 14. The upper insulating layer 123 has an opening an inner wall 123A of which is tapered. The outer perimeter of the opening of the upper insulating layer 123, delineated by the inner wall 123A on the side of the anode electrode 11, has a shape retracted toward the inner side, from the outer perimeter of the opening of the intermediate insulating layer 122, by a certain distance. The outer perimeter delineated by the inner wall 123A of the opening of the upper insulating layer 123 increases in a direction moving away from the anode electrode 11. A part including the thickness of the inner wall 123A of the upper insulating layer 123 forms an eave 123B, as will be described later. In other words, the eave 123B is tapered.

On the tapered inner wall 123A of the upper insulating layer 123, the organic deposition of the organic layer 13, which will be described later, does not stick very well. Therefore, it is preferable to keep the thickness of the eave 123B of the upper insulating layer 123 thin, or to use a small taper angle, with respect to the total thickness of the inner wall 121A, the inner wall 122A, and the inner wall 123A. In this manner, it is possible to improve how the organic deposition of the organic layer 13 sticks to the inner wall 123A. The largest angle by which the organic deposition of the organic layer 13 can be improved corresponds to an example of the "predetermined angle". It is also possible to reduce the thickness as well as the taper angle of the eave 123B.

An opening 120 of the pixel-isolating insulation film 12 is formed by the opening of the lower insulating layer 121, the opening of the intermediate insulating layer 122, and the opening of the upper insulating layer 123. The opening 120 defines the light-emitting region of the light-emitting element 1. The shape of the opening 120 in a plan view is not limited to any particular shape, and is a rectangle, a square, or a circle, for example.

In this embodiment, along the periphery of the opening 120, the edge of the opening of the upper insulating layer 123 projects further toward the inner side of the opening 120 than the edge of the opening of the intermediate insulating layer 122, and this projecting part serves as the eave 123B. In other words, along the periphery of the opening 120, the inner wall 122A of the intermediate insulating layer 122 is recessed with respect to the position of an end of the inner wall 123A of the upper insulating layer 123, the end being that on the side of the anode electrode 11.

By providing the eave 123B, a first OLED layer 131 and a CGL 132 in the organic layer 13 are cut, as will be described later. Therefore, the shape of the eave 123B, including its thickness, length, and taper angle, and the shape of the intermediate insulating layer 122 including its thickness are determined in such a manner that the first OLED layer 131 and the CGL 132 are both cut along the organic layer cut portion P as the first OLED layer 131 and the CGL 132 are vapor-deposited. The height and the width of the eave 123B are set to those allowing the first OLED layer 131 and the CGL 132 to be cut, depending on the thicknesses, the materials, and the etching conditions of the upper insulating layer 123 and the intermediate insulating layer 122, the width of the opening 120, the materials and the thicknesses of the first OLED layer 131 and the CGL 132, and the like.

In this embodiment, along the periphery of the opening 120, the edge of the opening of the lower insulating layer 121 projects further toward the inner side of the opening 120 than the edge of the opening of the upper insulating layer 123. It is preferable for the distance L between the position of the end of the inner wall 121A of the lower insulating layer 121 and the position of the end of the inner wall 123A of the upper insulating layer 123, to be a certain distance, the ends being those on the side of the anode electrode 11. For example, the distance L may be 200 nm. By setting the distance L to a certain length or more, it is possible to improve the vertical leakage along the pixel edge.

The lower insulating layer 121, the upper insulating layer 123, and the intermediate insulating layer 122 are made of different materials among inorganic insulating materials including silicon oxide, silicon nitride, silicon oynitride, and aluminum oxide with which etching selectivity can be achieved. In this embodiment, the lower insulating layer 121 and the upper insulating layer 123 are made of silicon oxide ($SiO_2$), and the intermediate insulating layer 122 is made of silicon nitride (SiN), as an example. However, only required for the lower insulating layer 121, the upper insulating layer 123, and the intermediate insulating layer 122 is to have etching selectivity, and different materials may be used for the lower insulating layer 121 and the upper insulating layer 123. Furthermore, it is also possible to use materials with which the etching selectivity between the lower insulating layer 121 and the upper insulating layer 123 can be achieved. As described above, by using materials with which the etching selectivity can be achieved, it becomes easier to process each of the tower insulating layer 121, the upper insulating layer 123, and the intermediate insulating layer 122 into a desirable shape.

The organic layer 13 includes a lamination of the first OLED layer 131, the charge generation layer (CGL) 132, and a second OLED layer 133. In addition, the organic layer 13 also includes, although not illustrated, an electron injection layer, an electron transport layer, a hole transport layer, and a hole injection layer.

The first OLED layer 131 is a blue light-emitting layer. By being subjected to an electric field, the first OLED layer 131 is caused to emit blue light, through the recombination of part of holes injected from the anode electrode 11 and part of electrons injected from the cathode electrode 14. The first OLED layer 131 contains, for example, at least one of a blue light-emitting material, a hole transport material, an electron transport material, and a both charge transport material. The blue light-emitting material may be a fluorescent or phosphorescent material. The first OLED layer 131 is formed by, for example, mixing 2.5 wt % of 4,4'-bis[2-{4-(N, N-diphenylamino)phenyl}vinyl] biphenyl (DPAVBi) to DPVBi.

The first OLED layer 131 is formed by deposition, e.g., vapor deposition. With this deposition on the eave 123B, a "shaded" region under the eave 123B and the elements deposited on the eave 123B is formed on a surface of the lower insulating layer 121, the surface being one on the side of the cathode electrode 14. The first OLED layer 131 is not deposited in this shaded region, and is therefore cut along the organic layer cut portion P. Such a phenomenon in which the organic layer becomes cut by the eave 123B and the element having been deposited on the eave 123B, as if the light is shaded thereby, during the vapor deposition process is sometimes referred to as a "shadowing phenomenon during the organic vapor deposition process".

The CGL 132 is a charge-generation layer made of a highly conductive material with a high hole mobility so as to supply carriers. The CGL 132 supplies equal amounts of charge by supplying electrons to the first OLED layer 131 and supplying holes to the second OLED layer 133, to maintain the equipotential surface in the CGL 132. With the CGL 132, the luminous efficiency is improved The CGL 132 is formed by deposition e.g., vapor deposition. Because the CGL 132 is laminated on the eave 123B and deposited on the first OLED layer 131, no deposition of the CGL 132 takes place in the shaded region, by being shaded under the eave 123B and the elements deposited on the eave 123B, on a surface of the lower insulating layer 121, the surface being that on the side of the cathode electrode 14, and the CGL 132 becomes cut along the organic layer cut portion B, due to the shadowing phenomenon during the organic vapor deposition process.

The second OLED layer 133 is a red and green light-emitting layer. By being subjected to an electric field, the second OLED layer 133 is caused to emit red light and green light through the recombination of part of holes injected from the anode electrode 11 and part of electrons injected from the cathode electrode 14. The second OLED layer 133 contains, for example, at least one of a red and green light-emitting material, a hole transport material, an electron transport material, and a both charge transport material. The red and green light-emitting material may be a fluorescent or phosphorescent material.

The second OLED layer 133 is formed by deposition, e.g., vapor deposition. The second OLED layer 133 is deposited across the CGL 132 laminated on the eave 123B and the CGL 132 laminated on the anode electrode 11. Although the CGL 132 is cut along the organic layer cut portion P, the interval is small. Therefore, the second OLED layer 133 deposited on the CGL 132 that is laminated on the eave 123B becomes connected with the second OLED layer 133 deposited on the CGL 132 that is laminated on the anode electrode 11. In other words, the second OLED layer 133 fills the opening of the organic layer cut portion P, and forms one continuous layer.

As a result of the opening of the organic layer cut portion P being filled, a space S surrounded by the pixel-isolating insulation film 12 and the organic layer 13 is formed. It is also possible for this space S to be filled with the second OLED layer 133.

The cathode electrode 14 is formed in a manner covering a surface of the second OLED layer 133 entirely, the surface being one on the opposite side of the anode electrode 11. The cathode electrode 14 is made of a conductive film that is transparent to light, such as a single-layer film of or a laminated film containing two or more of ITO, IZO, ZnO, InSnZnO, MgAg alloy, or Ag. For a bottom-emitting element, the same materials as those listed for the anode electrode 11 may be used.

In the manner above, because the first OLED layer 131 that is a blue light-emitting layer and the second OLED layer 133 that is a red light-emitting layer and a green light-emitting layer are laminated, and the light emitted from these layers become mixed, white light is emitted from the organic layer 13. However, the organic layer 13 is not limited to such a lamination structure, as long as the organic layer 13 is configured to emit white light. For example, the organic layer 13 may also be a lamination of a blue light-emitting layer and a yellow light-emitting layer, or a lamination of a blue light-emitting layer and an orange light-emitting layer.

A display device using the light-emitting element 1 will now be explained. In the display device, a protection layer is formed on a surface of the cathode electrode 14, the surface being one on the opposite side of the second OLED layer 133. The protection layer is made of silicon nitride, silicon oxide or a metal oxide, for example. In the display device, a color filter layer is also formed on the protection layer, on the opposite side of the cathode electrode 14. The color filter layer extracts the white light generated in the light-emitting element 1 as red light, green light, or blue light in units of a pixel. The color filter layer is disposed at such a position that one of the red filter layer, the green filter layer, and the blue filter layer faces the light-emitting element 1, for example.

Manufacturing Method

The light-emitting element 1 is manufactured by combining general semiconductor processes. An example of a manufacturing process of the light-emitting element 1 and a display device using the light-emitting element 1 will now be generally explained.

A drive circuit layer is formed on a substrate through a MOS process, and a photosensitive resin, for example, is then applied to the entire surface. A smoothing layer is then formed by exposing and developing the photosensitive resin, and patterning the photosensitive resin into a predetermined shape. After a connection hole is formed at the same time as the patterning, a plug is formed by filling the connection hole with a conductive material. After a metallic layer is formed with sputtering, for example, the anode electrode 11 separated in units of a light-emitting element 1 (in units of a pixel) is then formed by wet etching, for example.

The pixel-isolating insulation film 12 having the opening 120 and the eave 123B is then formed.

Specifically, to begin with, the lower insulating layer 121, the intermediate insulating layer 122, and the upper insulating layer 123 are laminated in the order listed herein, across the entire surface of the substrate. At this time, with the chemical vapor deposition (CVD), a film of SiON or SiN, for example, is formed as the lower insulating layer 121, a film of $SiO_2$, for example, is formed as the intermediate insulating layer 122, and a film of SiON or SiN, for example, is formed as the upper insulating layer 123.

An opening is then formed in the upper insulating layer 123 by removing only a second insulating layer 15B selectively with etching using photolithography, from the lamination of the lower insulating layer 121, the intermediate insulating layer 122, and the upper insulating layer 123, for example. Specifically, a photoresist film is formed and exposed (applied with patterning) on the upper insulating layer 123, for example. The upper insulating layer 123 is then processed down to the surface of the intermediate insulating layer 122 by anisotropic (or isotropic) dry etching (or wet etching), for example, under a condition where the etching selectivity between the upper insulating layer 123 and the intermediate insulating layer 122 can be achieved. At this time, etching is performed in such a manner that the inner wall 123A of the upper insulating layer 123, that is, the eave 123B becomes tapered. It is preferable for the eave 123B of the upper insulating layer 123 to be formed so as to be thin or to have a small taper angle with respect to the thickness of the inner wall of the opening 120. After the upper insulating layer 123 is processed, the photoresist is peeled off.

The exposed intermediate insulating layer 122 is then removed selectively to form an opening in the intermediate insulating layer 122. At this time, the intermediate insulating layer 122 is processed down to the surface of the lower insulating layer 121 by isotropic dry etching or isotropic wet etching, for example, under a condition where the etching selectivity between the intermediate insulating layer 122, the upper insulating layer 123, and the lower insulating layer 121 can be achieved. As a result, the opening of the intermediate insulating layer 122 is formed, and the position of the inner wall 122A of the intermediate insulating layer 122 becomes retracted from the end of the inner wall 123A of the upper insulating layer 123, the end being that on the side of the intermediate insulating layer 122, to form the eave 123B.

The exposed lower insulating layer 121 is then selectively removed to form the opening 120. At this time, the lower insulating layer 121 is processed down to the surface of the anode electrode 11 by isotropic dry etching or isotropic wet etching, for example, under a condition where the etching selectivity between the lower insulating layer 121 and the intermediate insulating layer 122 can be achieved. At this time, etching is performed in such a manner that the inner wall 121A of the lower insulating layer 121 becomes tapered. The tapering is performed in such a manner that a certain distance is ensured as the distance L between an end of the inner wall 121A of the lower insulating layer 121 and an end of the inner wall 123A of the upper insulating layer 123, the ends being those on the side of the anode electrode 11.

The hole injection layer and the hole transport layer are then formed sequentially across the entire surface of the substrate by vacuum vapor deposition, sputtering, or coating such as spin coating or die coating, in the order listed herein. At this time, the hole injection layer is cut with the eave 123B provided along the opening 120 of the pixel-isolating insulation 12.

The first OLED layer 131 is then formed by vacuum vapor deposition, sputtering, or coating such as spin coating or die coating, for example. At this time, the first OLED layer 131 becomes cut by the eave 123B formed along the opening 120 of the pixel-isolating insulation film 12.

The CGL 132 is then formed by vacuum vapor deposition, sputtering, or coating such as spin coating or die coating, for example. At this time, the CGL 132 is cut by the eave 123B formed along the opening 120 of the pixel-isolating insulation film 12.

In the manner described above, in this embodiment, with the eave 123B, the first OLED layer 131 and the CGL 132 can be formed in a manner separated in units of an anode electrode 11, without patterning the first OLED layer and the CGL 132 separately.

The second OLED layer 133 is then formed by vacuum vapor deposition, sputtering, or coating such as spin coating or die coating, for example. At this time, the second OLED layer 133 is formed connectedly, without being cut by the eave 123B. As the cut portions of the first OLED layer 131 and the CGL 132 are filled with the second OLED layer 133, the space S is formed.

The cathode electrode 14 made of the material described above is then formed across the entire surface of the substrate by vacuum vapor deposition or sputtering, for example. In the manner described above, the organic layer 13 and the cathode electrode 14 can be formed continuously on the anode electrode 11, in a vacuum atmosphere, for example. This achieves an element structure in which the organic layer 13 and the cathode electrode 14 are formed not only in a region immediately above the anode electrode 11 but also in a region between adjacent anode electrodes 11 (between pixels). In the manner described above, the light-emitting element 1 is formed.

A protection layer is then formed on the light-emitting element 1 by CVD or sputtering, for example. A sealing substrate having a color filter layer is then bonded onto the protection layer via an adhesive layer. In the manner described above, it is possible to manufacture a display device including the light-emitting element 1.

Figure 2:
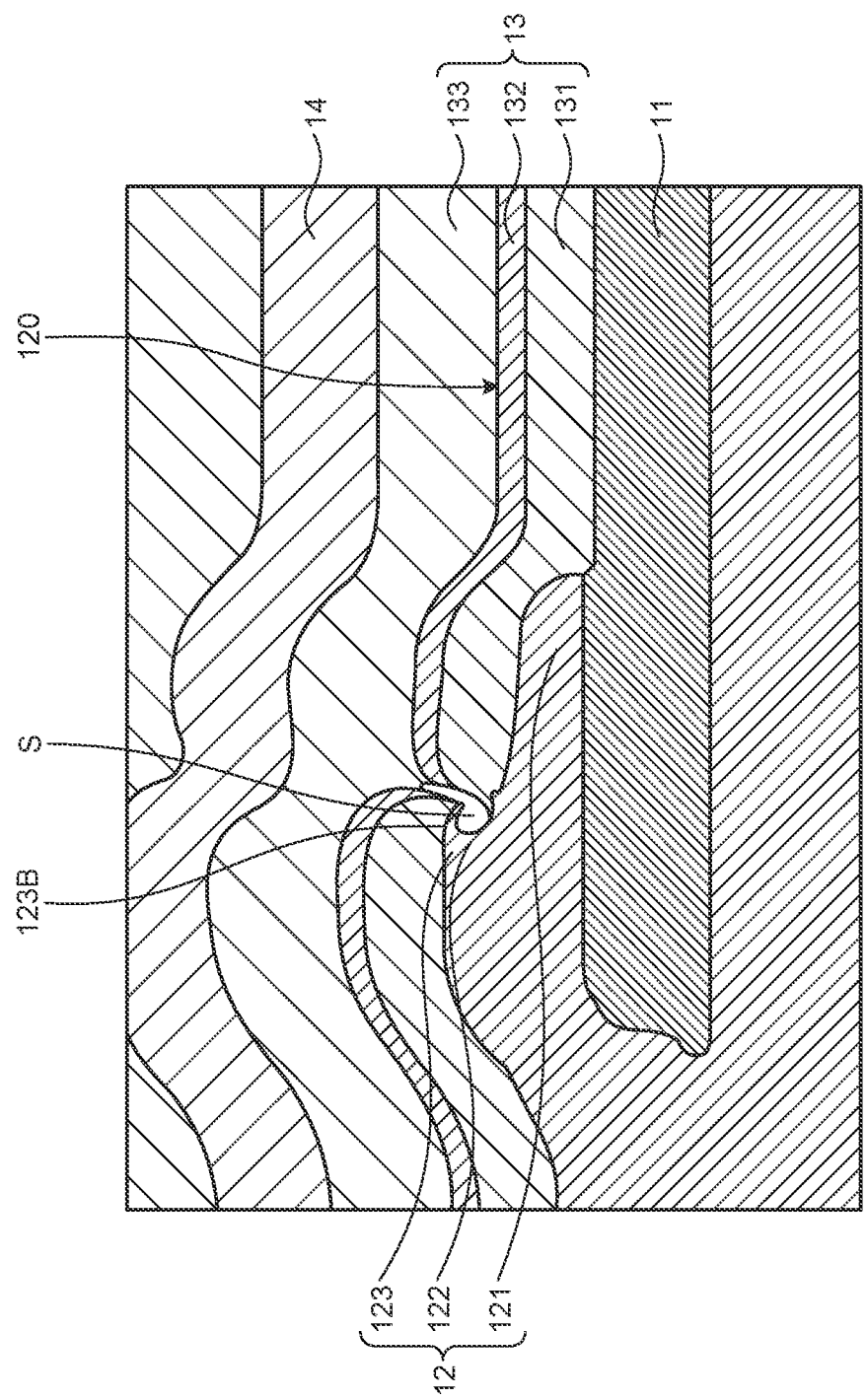
FIG. 2 is a schematic of one example of the light-emitting element according to the first embodiment.

FIG. 2 is a schematic of one example of the light-emitting element according to the first embodiment. As illustrated in FIG. 2, the pixel-isolating insulation film 12 includes the lower insulating layer 121, the intermediate insulating layer 122, and the upper insulating layer 123 having the opening 120. The eave 123B is formed by making the intermediate insulating layer 122 recessed further away from to the center of the opening 120, than the upper insulating layer 123. By providing the eave 123B, the first OLED layer 131 and the CGL 132 become cut, as illustrated in FIG. 2. In the example illustrated in FIG. 2, the space S is formed.

Actions and Advantageous Effects

To the light-emitting element 1 according to this embodiment, a drive current is injected. When this drive current is injected into the first OLED layer 131 and the second OLED layer 133 of the organic layer 13 through the anode electrode 11 and the cathode electrode 14 via the CGL 132, holes and electrons recombine and emit light.

Once white light is generated as the light emitted from the first OLED layer 131 and the light emitted from the second OLED layer 133 are become mixed, the white light becomes reflected between the anode electrode 11 and the cathode electrode 14 repeatedly, passes through the cathode electrode 14, the protection layer, and the color filter, and is taken out. Specifically, the white light emitted from the organic layer 13 and passing through the cathode electrode 14 is color-separated into red, green, and blue (RGB) color light, for example, by the color filter layer. In other words, from the white light emitted from the light-emitting element 1, the red light is selectively passed through the red filter layer, the green light is selectively passed through the green filter layer, and the blue light is selectively passed through the blue filter layer. In this manner, an image is displayed using a set of light-emitting elements 1 each emitting R, G, or B color light, as one pixel.

In the display device including the light-emitting element 1, the organic layer 13 and the cathode electrode 14 are continuously deposited entirely without being patterned in units of a pixel.

Figure 3:
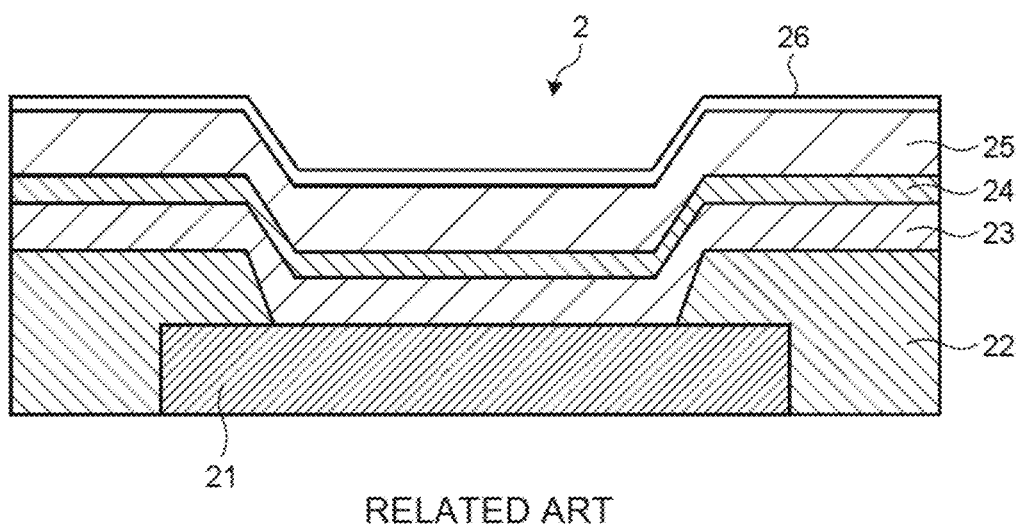
FIG. 3 is a cross-sectional view of a light-emitting element with a continuous CGL.

FIG. 3 is a cross-sectional view of a light-emitting element with a continuous CGL. Similarly to the light-emitting element 1 according to this embodiment, a light-emitting element 2 includes an anode electrode 21, a pixel-isolating insulation film 22, a first OLED layer 23, a CGL 24, a second OLED layer 25, and a cathode electrode 26. However, the pixel-isolating insulation film 22 does not have an eave in the middle of the inner wall of the opening. Therefore, in the conventional light-emitting element 2, as illustrated in FIG. 3, the first OLED layer 23 and the CGL 24 are not cut in units of an anode electrode 21 (in units of a pixel). Hence, adjacent pixels are electrically connected via the CGL 24 that is a layer with high hole mobility.

Figure 4:
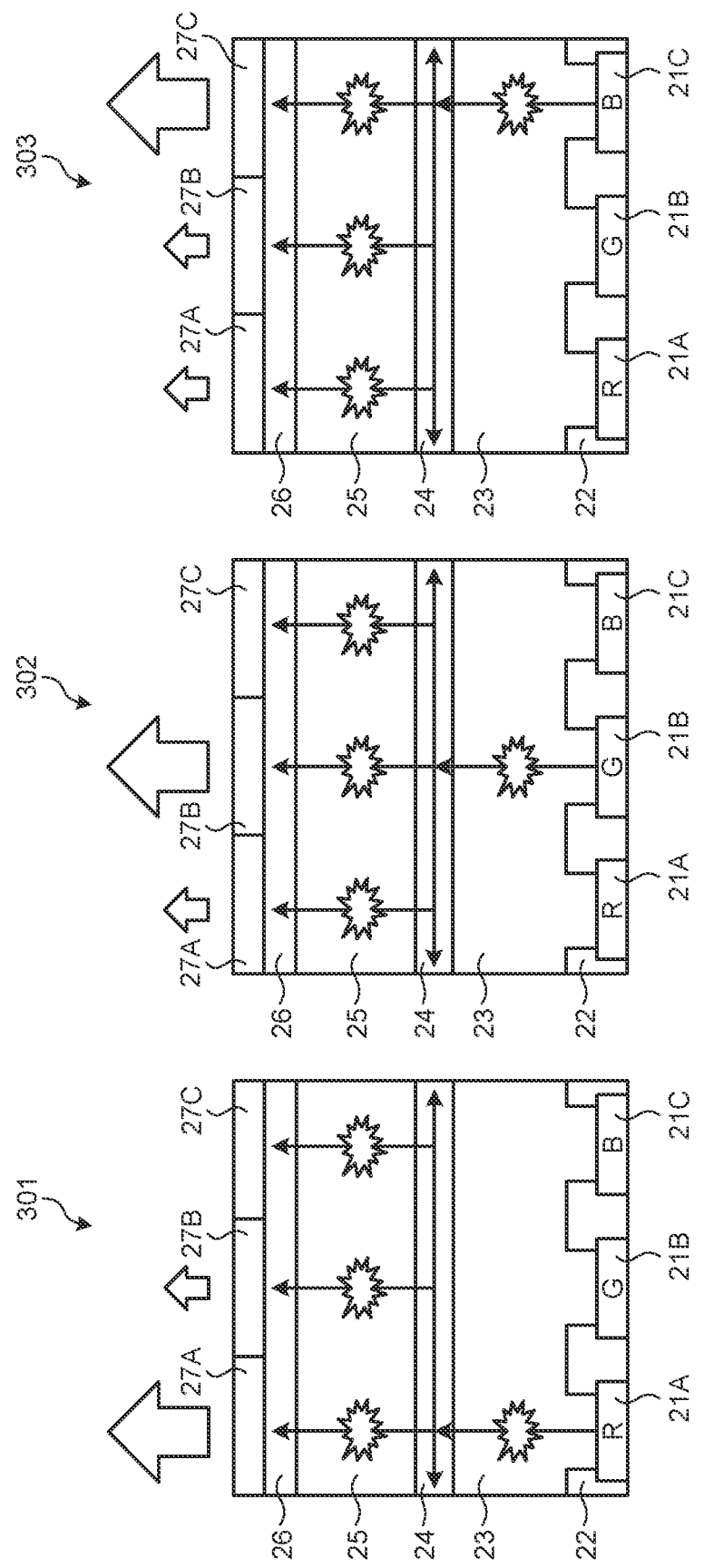
FIG. 4 is a schematic illustrating the effect of the leakage current in the CGL.

FIG. 4 is a schematic illustrating the effect of a leakage current in the CGL. A cross section 301 represents a condition in which a current is flowing into an anode electrode 21A corresponding to a red filter layer 27A. A cross section 302 represents a condition in which a current is flowing into an anode electrode 21B corresponding to a green filter layer 27B. A cross section 303 represents a condition in which a current is flowing into an anode electrode 21C corresponding to a blue filter layer 27C.

As in the cross section 301, when a current flows into the anode electrode 21A and the cathode electrode 26, emission of light takes place at the position corresponding to the red filter layer 27A in the first OLED layer 23. The current then flows into the second OLED layer 25 via the CGL 24. At this time, the current leaks to the adjacent pixels across the CGL 24. Therefore, the current flows to the positions corresponding to the green filter layer 27B and the blue filter layer 27C, and emission of light takes place at the positions corresponding to the red filter layer 27A, the green filter layer 27B, and the blue filter layer 27C in the second OLED layer 25. As a result, red and green light is generated, and the red light is extracted by the red filter layer 27A, and the green light is extracted by the green filter layer 27B.

As in the cross section 302, when a current flows into the anode electrode 21B and the cathode electrode 26, emission of light takes place at the position corresponding to the green filter layer 27B in the first OLED layer 23. The current then flows into the second OLED layer 25 via the CGL 24. At this time, the current leaks to the adjacent pixels across the CGL 24. Therefore, the current flows to the positions corresponding to the red filter layer 27A and the blue filter layer 27C, and emission of light takes place at the positions corresponding to the red filter layer 27A, the green filter layer 27B, and the blue filter layer 27C in the second OLED layer 25. As a result, red and green light is generated, and the red light is extracted by the red filter layer 27A, and the green light is extracted by the green filter layer 27B.

As in the cross section 303, when a current flows into the anode electrode 21C and the cathode electrode 26, emission of light takes place at the position corresponding to the blue filter layer 27C in the first OLED layer 23. The current then flows into the second OLED layer 25 via the CGL 24. At this time, the current leaks to the adjacent pixels across the CGL 24. Therefore, the current flows into the positions corresponding to the red filter layer 27A and the green filter layer 27B, and emission of light takes place at the positions corresponding to the red filter layer 27A, the green filter layer 27B, and the blue filter layer 27C in the second OLED layer 25. As a result, at the same time as the blue light is extracted by the blue filter layer 27C, the red and the green light is generated, and the red light is extracted by the red filter layer 27A, and the green light is extracted by the green filter layer 27B.

As described above, in the conventional light-emitting element 2, because pixels other than the pixel to which a current is applied are also excited and caused to emit light, the light emission properties deteriorate. By contrast, in this embodiment, the eave 123B is provided in the middle of the inner wall of the opening 120 of the pixel-isolating insulation film 12, and the first OLED layer 131 and the CGL 132 are cut by the eave 123B. In particular, because the CGL 132 is cut, the CGL 132 is electrically isolated between adjacent pixels, while the organic layer 13 and the cathode electrode 14 are formed continuously and entirely across the anode electrodes 11.

By providing the pixel-isolating insulation film 12 with the opening 120 that has the eave 123B to the anode electrode 11, which is provided in units of a pixel, the CGL 132 can be electrically isolated among the pixels. As a result, a current leakage can be suppressed in a structure in which the organic layer 13 is continuously deposited across the entire pixels. In the manner described above, it is possible to suppress the excitation and the light emissions from the pixels other than the pixel to which a current is applied, and to improve the charge injection efficiency (hole injection efficiency in this example) and the luminous efficiency. Furthermore, because the current leakage to the adjacent pixels is reduced, it is also possible to suppress the chances of color mixing.

First Modification

Figure 5:
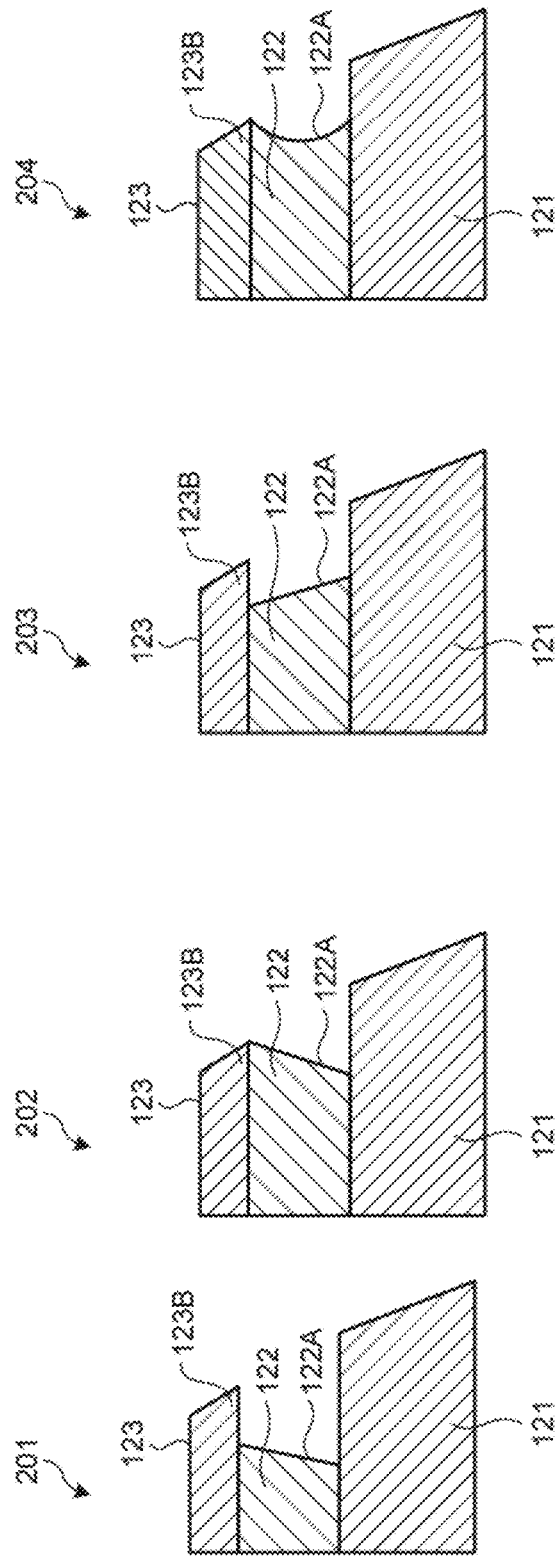
FIG. 5 is a schematic generally illustrating cross sections of pixel-isolating insulation films according to a first modification of the first embodiment.

In the light-emitting element 1 according to this modification, the intermediate insulating layer 122 has a shape that is different from that according to the first embodiment. FIG. 5 is a schematic generally illustrating cross sections of pixel-isolating insulation films according to a first modification of the first embodiment. Each of these pixel-isolating insulation films 12 represented in the cross sections 201 to 204 in FIG. 5 has an intermediate insulating layer 122 with a different shape.

In the light-emitting element 1 according to the first embodiment, the inner wall 122A of the opening of the intermediate insulating layer 122 has a tapered shape perpendicular to the surface of the anode electrode 11. In the explanation hereunder, the shape of the pixel-isolating insulation film 12 in the light-emitting element 1 according to the first embodiment will be referred to as a standard shape.

Contrasting to this, the inner wall 122A in the cross section 201 has a tapered shape in which the size of the opening increases from the side of the cathode electrode 14 toward the side of the anode electrode 11, that is, has a shape tapered in a reverse direction to that of the eave 123B. In this example, the position of an end of the opening of the intermediate insulating layer 122, the end being that on the side of the cathode electrode 14, is further away from the center of the opening, than the position of the end of the opening of the upper insulating layer 123, the end being that on the side of the anode electrode 11.

The inner wall 122A in the cross section 202 has a shape tapered in a reverse direction to that of the eave 123B, in the same manner as in the cross section 201. In this example, however, the position of an end of the opening of the intermediate insulating layer 122, the end being that on the side of the cathode electrode 14, is matched with the position of an end of the opening of the upper insulating layer 123, the end being that on the side of the anode electrode 11.

The inner wall 122A in the cross section 203 has a tapered shape in which the size of the opening decreases from the side of the cathode electrode 14 toward the side of the anode electrode 11, that is, has a shape tapered in the same direction as that of the eave 123B. In this example, the position of an end of the opening of the intermediate insulating layer 122, the end being that on the side of the cathode electrode 14, is further away from the center of the opening, than the position of the end of the opening of the upper insulating layer 123, the end being that on the side of the anode electrode 11.

The inner wall 122A in the cross section 204 has a concaved shape with respect to the center of the opening. In FIG. 5, the position of the end of the opening of the intermediate insulating layer 122, the end being that on the side of the cathode electrode 14, is matched with the position of an end of the opening of the upper insulating layer 123, the end being that on the side of the anode electrode 11. However, the position of the end of the opening of the intermediate insulating layer 122, the end being that on the side of the cathode electrode 14, may also be positioned further away from the center of the opening, than the position of the end of the opening of the upper insulating layer 123, the end being that on the side of the anode electrode 11.

For the light-emitting element 1 according to this modification, it is possible to use any one of the cross sections 201 to 204. With any shape of the cross sections 201 to 204, the first OLED layer 131 and the CGL 132 are cut due to the shadowing phenomenon taking place during the organic vapor deposition process.

As described above, the light-emitting element 1 according to this modification includes the pixel isolating insulation film 12 having a shape different from the standard shape, but the CGL 132 is cut even with such a pixel-isolating insulation film 12. Therefore, it is possible to suppress the current leakage, and to suppress the excitation of and the light emission from the pixels other than that to which a current is applied, and to improve the light emission property. In the manner described above, the shape of the pixel-isolating insulation film 12 is not limited to any particular shape, as long as the CGL 132 can be cut by providing the eave 123B, due to the shadowing phenomenon taking place during the organic vapor deposition process.

Second Modification

Figure 6:
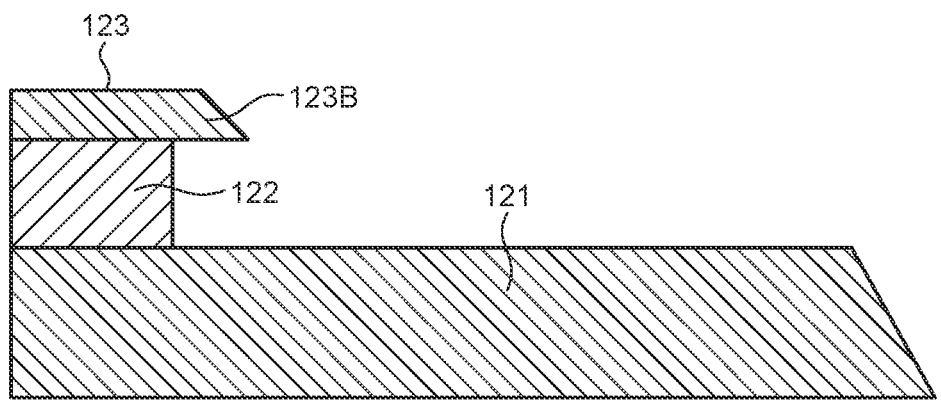
FIG. 6 is a schematic illustrating a cross section of a pixel-isolating insulation film according to a second modification of the first embodiment.

FIG. 6 is a schematic illustrating a cross section of a pixel-isolating insulation film according to a second modification of the first embodiment. In the light-emitting element 1 according to this modification, as illustrated in 6, the distance from an end of the upper insulating layer 123 and an end of the lower insulating layer 121, both of the ends being those on the opening side, is longer than that in the pixel-isolating insulation film 12 illustrated in FIG. 1.

By increasing the distance from the end of the upper insulating layer 123 to the end of the lower insulating layer 121, the ends being those on the side of the opening, in the manner described above, it is possible to reduce the deterioration in the coating properties of the second OLED layer 133, the cathode electrode 14, and the protection film.

Third Modification

Figure 7:
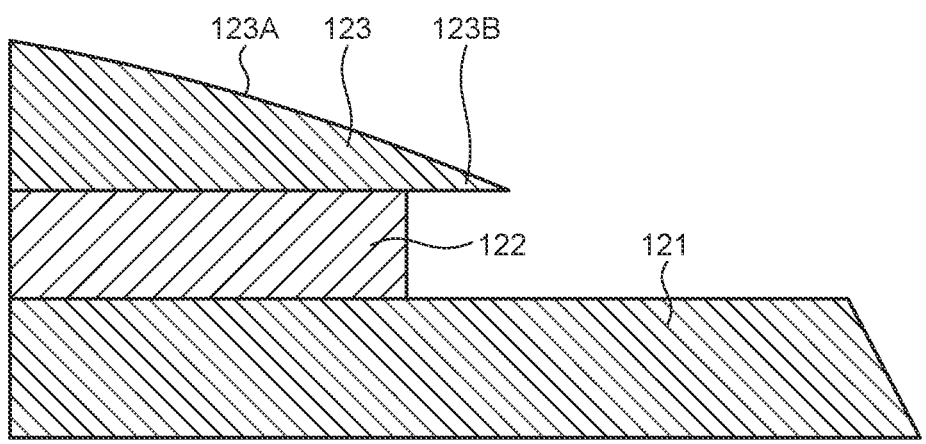
FIG. 7 is a schematic illustrating a cross section of a pixel-isolating insulation film according to a third modification of the first embodiment.

FIG. 7 is a schematic illustrating a cross section of a pixel-isolating insulation film according to a third modification of the first embodiment in the light-emitting element 1 according to this modification, as illustrated in FIG. 7, the thickness of the upper insulating layer 123 is set greater than that of the upper insulating layer 123 included in the pixel-isolating insulation film 12 illustrated in FIG. 1. In addition, the taper angle of the inner wall 123A is set smaller than that of the inner wall 123A included in the pixel-isolating insulation film 12 illustrated in FIG. 1.

In this manner, by reducing the taper angle of the inner wall 123A, the first OLED layer 131 and the CGL 132 are cut even when the upper insulating layer 123 is thick. Hence, the pixel-isolating insulation film 12 of the light-emitting element 1 enables a selection as to whether to reduce the thickness of the upper insulating layer 123 or to reduce the taper angle of the inner wall 123A, in order to cut the first OLED layer 131 and the CGL 132.

Second Embodiment

A second embodiment will now be explained. A light-emitting element 1 according to this embodiment is different from that according to the first embodiment in that another layer added to the pixel-isolating insulation film 12, in addition to the lower insulating layer 121, the intermediate insulating layer 122, and the upper insulating layer 123. The light-emitting element 1 according to this embodiment has the same structure as that illustrated in FIG. 1, except for the shape of the pixel-isolating insulation film 12.

Figure 8:
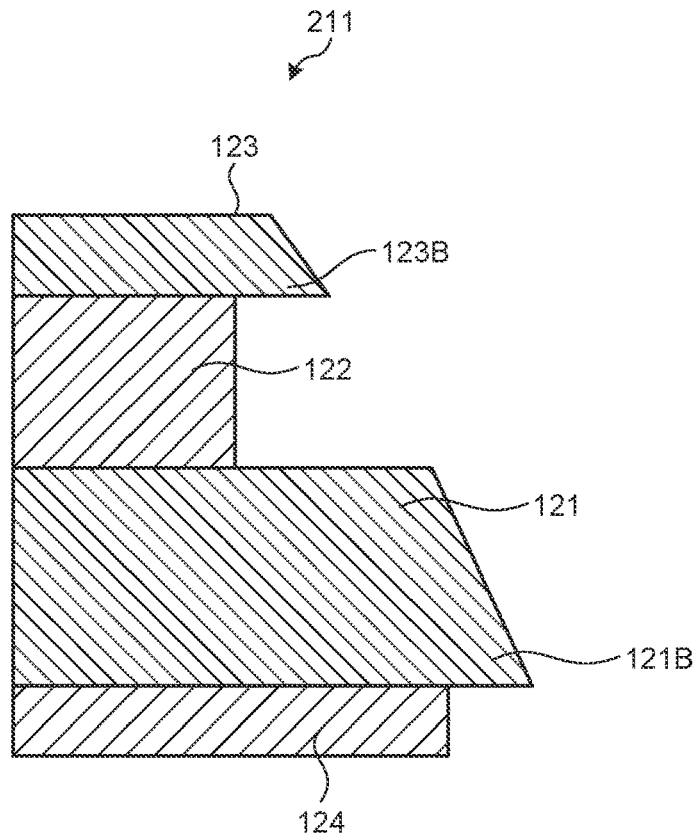
FIG. 8 is a cross-sectional view of a pixel isolating insulation film according to a second embodiment.

FIG. 8 is a sectional view of an image-isolating insulation film according to a second embodiment. The pixel-isolating insulation film 12 according to this embodiment includes a lowermost insulating layer 124 under the lower insulating layer 121, as illustrated in a cross section 211. The opening 120 of the pixel-isolating insulation film 12 is formed in a manner including an opening of the lowermost insulating layer 124.

The inner wall of the opening of the lowermost insulating layer 124 has a region further away from the center of the opening 120 than an end of the inner wall of the opening of the lower insulating layer 121, the end being that on the anode electrode 11 side. In other words, the inner wall of the opening of the lowermost insulating layer 124 has a region recessed further away from the center of the opening 120, than the end of the inner wall of the opening of the lower insulating layer 121, the end being that on the side of the anode electrode 11. In this manner, a part of the lower insulating layer 121 forms an eave 121B.

From the viewpoint of smoothness, the height of the eave 121B is preferably set as small as possible to a degree allowing the hole injection layer disposed on the side of the anode electrode 11 of the first OLED layer 131 in the organic layer 13 to be cut thereby. The height and the width of the eave 121B are set to those allowing the hole injection layer to be cut thereby, based on the thicknesses and the materials of, and the etching conditions for the lower insulating layer 121 and the lowermost insulating layer 124, the width of the opening 120, and the material and thickness of the hole injection layer, for example. The layer cut with the lowermost insulating layer 124 is not limited to the hole injection layer, and other layers of an organic layer 121 may be cut.

The lowermost insulating layer 124 is formed by following the method described below. The lower insulating layer 121 is selectively removed, to form an opening and to expose the lowermost insulating layer 124. The exposed lowermost insulating layer 124 is then selectively removed to form an opening of the lowermost insulating layer 124. At this time, the lowermost insulating layer 124 is processed down to the surface of the anode electrode 11 by isotropic dry etching or isotropic wet etching, for example, under a condition where the etching selectivity between the lowermost insulating layer 124 and the lower insulating layer 121 can be achieved. As a result, the opening of the lowermost insulating layer 124 is formed, and the inner wall of the lowermost insulating layer 124 becomes recessed from an end of the lower insulating layer 121, the end being that on the side of the lowermost insulating layer 124, to form the eave 121B. This eave 121B corresponds to an example of a "lower-end layer cutting eave".

By providing the lowermost insulating layer 124 and forming the eave 121B, the hole injection layer of the organic layer 13 is cut by the shadowing phenomenon during the organic vapor deposition process, at the time of vapor deposition. In other words, the hole injection layer of the organic layer 13 is cut in units of an anode electrode 11 (in units of a pixel). In this embodiment, the hole injection layer is cut by the eave 121B, but in a structure in which the anode and the cathode are reversed, the electron injection layer in the organic layer 13 is cut by the eave 121B. In other words, the hole injection layer or the electron injection layer is a layer positioned on an end of the organic layer 13, and one of these layers positioned on the side of the anode electrode 11 corresponds to the lower end layer and is cut by the eave 121B.

In the same manner as in the first embodiment, the first OLED layer 131 and the CGL 132 are cut by the eave 123B, due to the shadowing phenomenon during the organic vapor deposition process, at the time of vapor deposition.

In the manner described above, the light-emitting element 1 according to this embodiment has the hole injection layer cut in units of a pixel. Between these pixels, a hole injection layer 17 can be isolated. Therefore, it is possible to suppress the current leakage in an element structure having a light-emitting layer shared across the entire pixels. Furthermore, since the current leakage in the hole injection layer can be suppressed, it is possible to increase the thickness of the hole injection layer, so that it is possible to further improve the hole injection efficiency, and, as a result, to improve the luminous efficiency.

Modification

Figure 9:
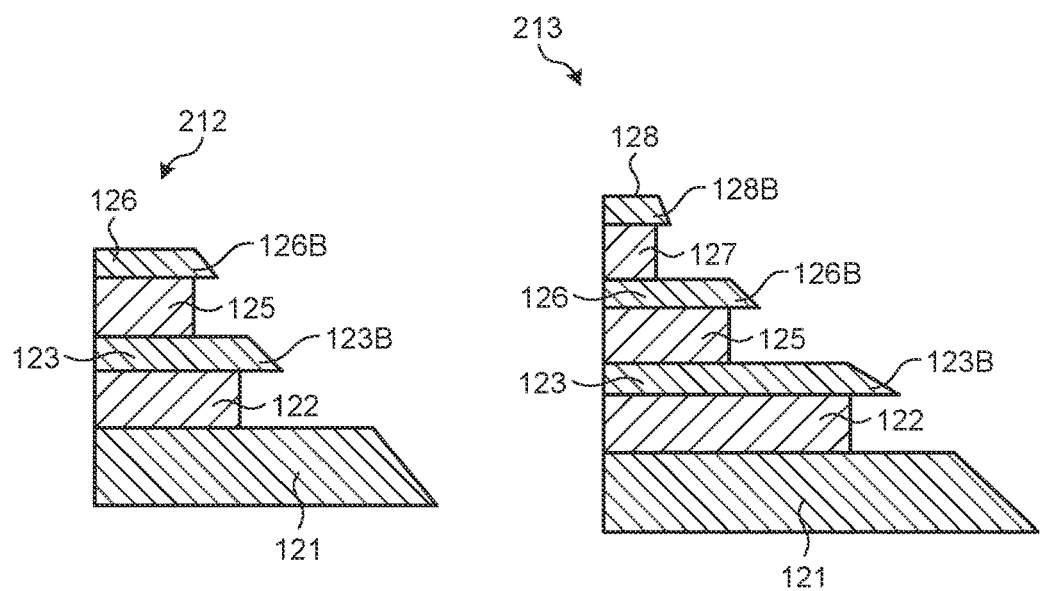
FIG. 9 is a schematic generally illustrating cross sections of pixel-isolating insulation films according to a modification of the second embodiment.

A light-emitting element 1 according to this modification includes the pixel-isolating insulation film 12 corresponding to light-emitting layers stacked in three or more levels. FIG. 9 is a schematic generally illustrating a cross section of a pixel-isolating insulation film according to the modification of the second embodiment. The pixel-isolating insulation film 12 of the light-emitting element 1 according to this embodiment has a shape illustrated as a cross section 212 or 213.

The pixel-isolating insulation film 12 having the cross section 212 includes a second intermediate insulating layer 125 and a second upper insulating layer 126, on top of the upper insulating layer 123. The inner wall of the second intermediate insulating layer 125 is positioned further away from the center of the opening 120 than the end of the second upper insulating layer 126, the end being that on side of the second intermediate insulating layer 125. With this structure, a part of the second upper insulating layer 126 forms an eave 126B.

The second intermediate insulating layer 125 and the second upper insulating layer 126 are manufactured following the same procedure as that for the intermediate insulating layer 122 and the upper insulating layer 123 described in the first embodiment.

In this example, the organic layer 13 has OLED layers stacked in three levels. These three levels of OLED layers are referred to as a first-level layer, a second-level layer, and a third-level layer, respectively, from the side of the anode electrode 11. The first CGL is laminated between the first-level layer and the second level layer, and the second CGL is laminated between the second-level layer and the third-level layer.

The first-level layer and the first CGL are cut in units of an anode electrode 11 (in units of a pixel) due to the shadowing phenomenon, achieved by providing the eave 123B, during the organic vapor deposition process. The second-level layer and the second CGL are cut in units of an anode electrode 11 (in units of a pixel) due to the shadowing phenomenon, achieved by providing the eave 126B, during the organic vapor deposition process.

The pixel-isolating insulation film 12 having the cross section 213 includes the second intermediate insulating layer 125, the second upper insulating layer 126, a third intermediate insulating layer 127, and a third upper insulating layer 128, on top of the upper insulating layer 123. The inner wall of the second intermediate insulating layer 125 is positioned further away from the center of the opening 120 than the end of the second upper insulating layer 126, the end being that on side of the second intermediate insulating layer 125. With this structure, a part of the upper insulating layer 123 forms an eave 126B. The inner wall of the third intermediate insulating layer 127 is positioned further away from the center or the opening 120 than the end of the third upper insulating layer 128, the end being that on side of the third intermediate insulating layer 127. With this structure, a part of the third upper insulating layer 128 forms an eave 128B.

The second intermediate insulating layer 125 and the second upper insulating layer 126, and the third intermediate insulating layer 127 and the third upper insulating layer 128 are manufactured following the same procedure as that for the intermediate insulating layer 122 and the upper insulating layer 123 described in the first embodiment.

In this example, the organic layer 13 has OLED layers stacked in four levels. These four OLED layers are referred to as a first-level layer, a second-level layer, and a third-level layer, and a fourth-level layer, respectively, from the side of the anode electrode 11. The first CGL is laminated between the first-level layer and the second-level layer; the second CGL is laminated between the second-level layer and the third-level layer; and the third CGL is laminated between the third-level layer and the fourth-level layer.

The first-level layer and the first CGL are cut in units of an anode electrode 11 (in units of a pixel) due to the shadowing phenomenon, achieved by providing the eave 123B, during the organic vapor deposition process. The second-level layer and the second CGL are cut in units of an anode electrode 11 (in units of a pixel) due to the shadowing phenomenon, achieved by providing the eave 126B, during the organic vapor deposition process. The third-level layer and the third CGL are cut in units of an anode electrode 11 (in units of a pixel) due to the shadowing phenomenon, achieved by providing the eave 128B, during the organic vapor deposition process.

Explained in this modification is an example with the pixel-isolating insulation film 12 having a shape corresponding to the organic layer including the three-levels of OLED layers or the four-levels of OLED layers, but the number of the levels of the OLED layers is not limited to any particular number, as long as the pixel-isolating insulation film 12 has the same number of eaves as that of the levels of OLED layers.

As explained above, in the light-emitting element 1 according to this embodiment, each CGL in the organic layer 13 including three or more levels of OLED layers and CGLs is cut in units of a pixel. As a result, it is possible to suppress a current leakage in the CGL. Therefore, it is possible to suppress the excitation of and the light emission from the pixels other than that to which a current is applied, and to improve the light emission properties.

Explained in this modification is an example in which the pixel-isolating insulation film 12 has the same number of eaves as that of the CGLs to be cut, but when there is any CGL to be cut by the inclination of the inner wall of the opening 120 having the eaves, it is possible to omit the eave corresponding to such a CGL. In other words, when the CGL to be cut includes the CGL to be cut by the inclination of the inner wall of the opening 120, it is possible to provide the pixel-isolating insulation film 12 with the eaves in a number obtained by subtracting the number of the CGL to be cut by the inclination from the total number of the CGL to be cut.

Third Embodiment

Figure 10:
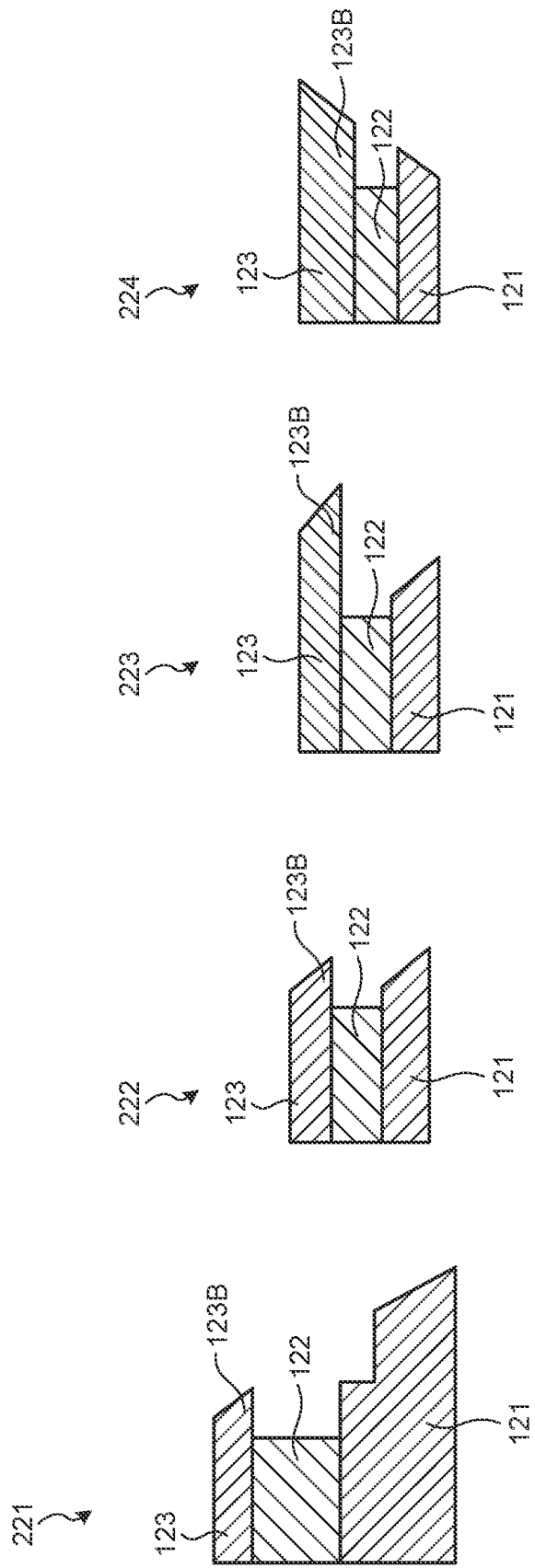
FIG. 10 is a sectional view of pixel-isolating insulation films according to a third embodiment.

FIG. 10 is sectional views of a pixel-isolating insulation films according to a third embodiment. The pixel-isolating insulation film 12 of the light-emitting element 1 according to this embodiment has a structure illustrated as any one of cross sections 221 to 224. The light-emitting element 1 according to this embodiment has the same structure as that illustrated in FIG. 1, except for the shape of the pixel-isolating insulation film 12.

The pixel-isolating insulation film 12 having the cross section 221 has the following structure. The lower insulating layer 121 has a step-like opening with two steps. The lower insulating layer 121 is formed in such a manner that the step on the side of the cathode electrode 14 is recessed further from the center of the opening, than the step on the side of the anode electrode 11.

Furthermore, in the inner wall of the opening of the lower insulating layer 121, the step on the side of the anode electrode 11 has such a tapered shape that the opening becomes smaller toward the anode electrode 11.

In the pixel-isolating insulation film 12 having the cross section 222, the lower insulating layer 121 and the upper insulating layer 123 are positioned in such a manner that their ends on the side of the opening are matched with each other.

In the pixel-isolating insulation film 12 having the cross section 223, the end of the opening of the upper insulating layer 123 is provided at a position nearer to the center of the opening, than the end of the lower insulating layer 121.

In the pixel-isolating insulation film 12 having the cross section 224, the inner walls of the openings of the upper insulating layer 123 and the lower insulating layer 121 are tapered in such a manner that the openings become larger toward the anode electrode 11. In addition, the end of the opening of the upper insulating layer 123 is provided at a position nearer to the center of the opening, than the end of the lower insulating layer 121.

The light-emitting element 1 according to this embodiment including the pixel-isolating insulation film 12 having any of the cross sections 221 to 224 includes the eave 123B in the middle of the inner wall of the pixel-isolating insulation film 12. With this, the CGL 132 provided to the light-emitting element 1 according to this embodiment is cut in units of an anode electrode 11 (in units of a pixel).

However, in the structure illustrated in FIG. 10, the deposition quality of the organic film may become poor, and result in an organic structure that is thin with respect to the flat parts of the pixel opening. The OLED voltage may then drop in such a part, and may cause a current leakage in the region with a low voltage, in the vertical direction of the organic device. Therefore, when a deterioration of the deposition quality of the organic film formed on the step portion of the pixel-isolating insulation film 12 tolerable, a current leakage can be suppressed and the excitation and the light emission in a pixel other than the pixels to which a current is applied can be suppressed by using the light-emitting element 1 according to this embodiment, and the light emission property can be improved.

Fourth Embodiment

By changing the shape of the part other than the eave 123B as in the cross section 221 in the third embodiment, it is possible to control how the organic layer 13 is cut by the shadowing phenomenon, which is achieved by providing the eave structure, during the organic vapor deposition. The light-emitting element 1 according to this embodiment has a pixel-isolating insulation film 12 with the shape of the parts other than the eave 123B changed, in the same manner as in the cross section 221. The light-emitting element 1 according to this embodiment has the same structure as that illustrated in FIG. 1, except for the shape of the pixel-isolating insulation film 12.

Figure 11:
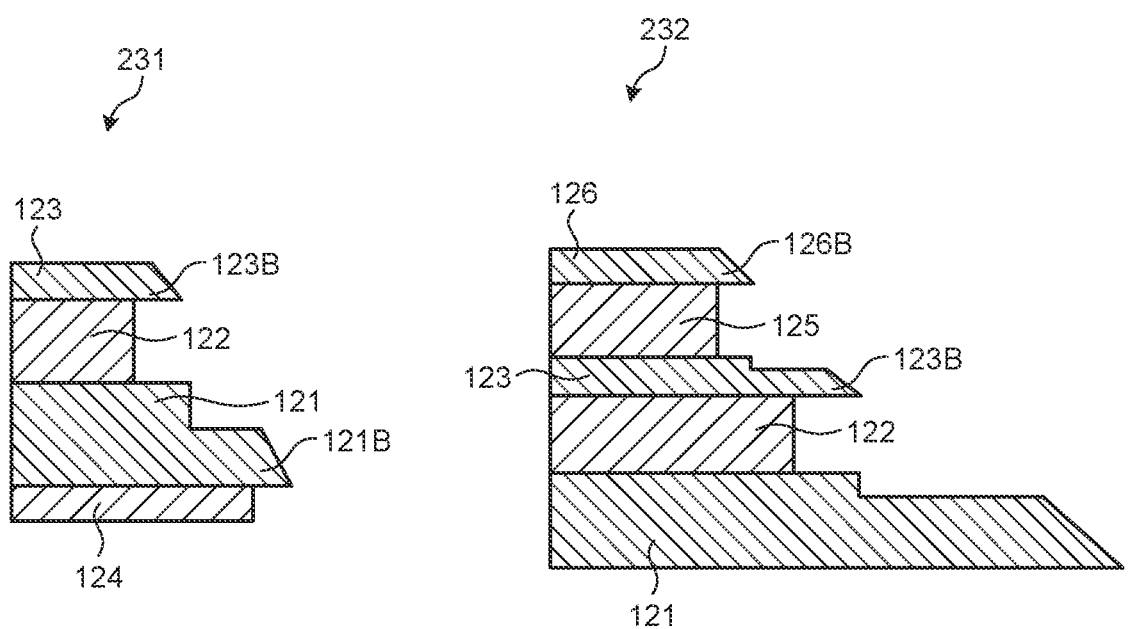
FIG. 11 is a sectional view of pixel-isolating insulation films according to a fourth embodiment.

FIG. 11 is a sectional view of pixel-isolating insulation films according to a fourth embodiment. The pixel-isolating insulation film 12 of the light-emitting element 1 according to this embodiment has a shape illustrated as a cross section 231 or 232.

In the pixel-isolating insulation film 12 having a cross section 231, the shape of the lower insulating layer 121 with the cross section 211 illustrated in FIG. 8 is changed in the same manner as in the lower insulating layer 121 with the cross section 211 illustrated in FIG. 10. By changing the shape of the lower insulating layer 121, it is possible to change the way in which the organic elements become deposited under the eave 123B, and to change a relation between the height of the eave 123B and the cut part of the organic layer 13.

In the light-emitting element 1 including the pixel-isolating insulation film 12 having the cross section 231, the hole injection layer is cut due to the shadowing phenomenon, achieved by providing the eave 121B, during the organic vapor deposition. Furthermore, by controlling how the organic layer 13 is cut by changing the shape of the lower insulating layer 121, the first OLED layer 131 and the CGL 132 are cut reliably at the time of vapor deposition, by the shadowing phenomenon, achieved by providing the eave 123B, during the organic vapor deposition. In other words, the light-emitting element 1 including the pixel-isolating insulation film 12 having the cross section 231 includes the first OLED layer 131 and the CGL 132 cut reliably in units of an anode electrode 11 (in units of a pixel).

In the pixel-isolating insulation film 12 having a cross section 232, the shape of the upper insulating layer 123 and the second upper insulating layer 126 with the cross section 212 illustrated in FIG. 9 is changed in the same manner as in the upper insulating layer 123 with the cross section 211 illustrated in FIG. 10. By changing the shape of the lower insulating layer 121, it is possible to change how the organic element below the eave 123B becomes deposited, and by changing the shape of the upper insulating layer 123, it is possible to change the how the organic element below the eave 126B becomes deposited, and to change a relation between the heights of the eaves 123B and 126B, and the cut portion of the organic layer 13. Explained herein is an example in which the organic layer 13 has three levels of light emitting layers that are the first-level layer, the second-level layer, and the third-level layer, and the first CGL and the second CGL are laminated between respective pairs of these layers.

In the light-emitting element 1 including the pixel-isolating insulation film 12 with the cross section 232, the first-level layer, the first CGL, the second-level layer, and the second CGL are cut due to the shadowing phenomenon, achieved by providing the eaves 123B and 126B, during the organic vapor deposition. Furthermore, by controlling how the organic layer 13 is cut by changing the shapes of the upper insulating layer 123 and the second upper insulating layer 126, the first-level layer, the first CGL, the second-level layer, and the second CGL are cut reliably at the time of the vapor deposition. In other words, the light-emitting element 1 including the pixel-isolating insulation film 12 having the cross section 232 includes the first-level layer, the first CGL, the second-level layer, and the second CGL that are reliably cut in units of an anode electrode 11 (in units of a pixel), for the organic layer 13 having three levels of light-emitting layers.

Although an example in which the light-emitting element 1 including the pixel-isolating insulation film 12 having the cross section 231 or 232 has been explained, even when the light-emitting element 1 includes the pixel-isolating insulation film 12 having the cross section 211 illustrated in FIG. 10, it is possible to control how the organic layer 13 is cut by changing the shape of the lower insulating layer 121 in the manner described above.

As described above, in the light-emitting element 1 according to this embodiment, by changing the shape of the part other than the eave 123B, it is possible to control how the organic layer 13 is cut by the shadowing phenomenon, achieved by providing the eave structure during the organic vapor deposition. In this manner, it is possible to cut the layers included in the target organic layer 13 reliably, so that it is possible to suppress the current leakage more reliably, to suppress the excitation of and the light emission from the pixels other than those to which a current is applied, and to improve the light emission property.

Fifth Embodiment

Figure 12:
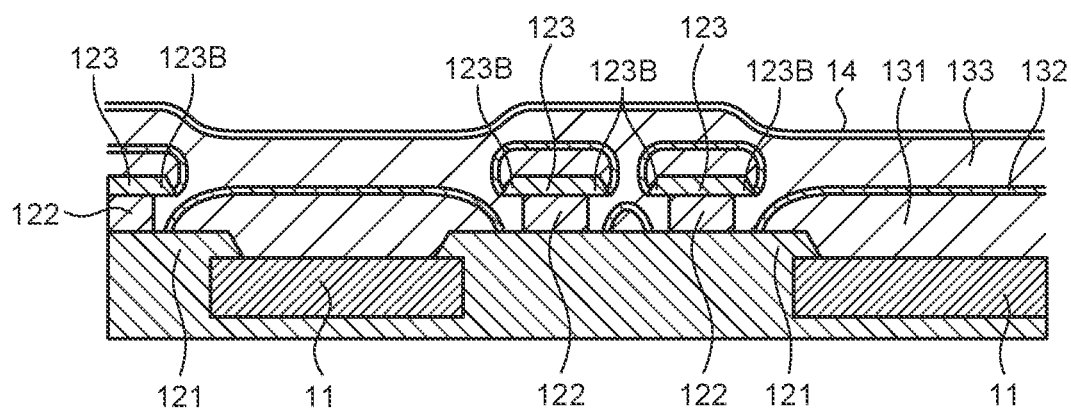
FIG. 12 is a cross-sectional view of a light-emitting element according to a fifth embodiment.

In the example explained in the embodiments above, it is assumed that one continuous lower insulating layer 121, intermediate insulating layer 122, and upper insulating layer 123 are provided between the adjacent anode electrodes 11 (between the pixels). In this embodiment, by contrast, the intermediate insulating layer 122 and the upper insulating layer 123 are provided in plurality, between the adjacent anode electrodes 11 (between the pixels). The light-emitting element 1 according to this embodiment has the same structure as that illustrated in FIG. 1. FIG. 12 is a cross-sectional view of the light-emitting element according to the fifth embodiment.

The lower insulating layer 121 is disposed in singularity, continuously between the adjacent anode electrodes 11. In other words, the lower insulating layer 121 covering up to the surface near the end of one anode electrode 11 is extended to cover up to near of the end of the anode electrode 11 adjacent thereto.

Two intermediate insulating layers 122 are then disposed between these adjacent anode electrodes 11, as illustrated in 12.

The upper insulating layer 123 is disposed individually on the surface of each of the intermediate insulating layers 122, the surface being that on the side of the cathode electrode 14. In other words, there are also two upper insulating layers 123 disposed between the adjacent anode electrodes 11.

In this configuration, the first OLED layer 131 is cut between the anode electrode 11 and the upper insulating layer 123 adjacent thereto, due to the shadowing phenomenon achieved by the eave 123B, during the organic vapor deposition process. The first OLED layer 131 is also cut between the two upper insulating layers 123 and the lower insulating layer 121 that are disposed between the adjacent anode electrodes 11, due to the shadowing phenomenon achieved by the eave 123B, during the organic vapor deposition process.

In this configuration, the CGL 132, too, is cut between the anode electrode 11 and the upper insulating layer 123 adjacent thereto, due to the shadowing phenomenon achieved by the eave 123B, during the organic vapor deposition process. The CGL 132 is also cut between the two upper insulating layers 123 and the lower insulating layer 121 that are disposed between the adjacent anode electrodes 11, due to the shadowing phenomenon achieved by the eave 123B, during the organic vapor deposition process.

The second OLED layer 133 is formed as a continuous layer without being cut between the pixels.

As described above, in the light-emitting element 1 according to this embodiment, the intermediate insulating layer 122 and the upper insulating layer 123 are disposed in plurality, between the adjacent anode electrodes 11 (between the pixels). In this manner, even if the intermediate insulating layer 122 and the upper insulating layer 123 are discontinuous between the adjacent anode electrodes 11, as long as an eave structure is present on the side of the anode electrode 11, it is possible for the light-emitting element 1 to have the CGL 132 cut in units of an anode electrodes 11 (in units of a pixel). Therefore, the light-emitting element 1 according to this embodiment, too, can suppress the current leakage, suppress the excitation of and the light emission from the pixels other than that to which a current is applied, and improve the light emission properties.

Sixth Embodiment

Figure 13:
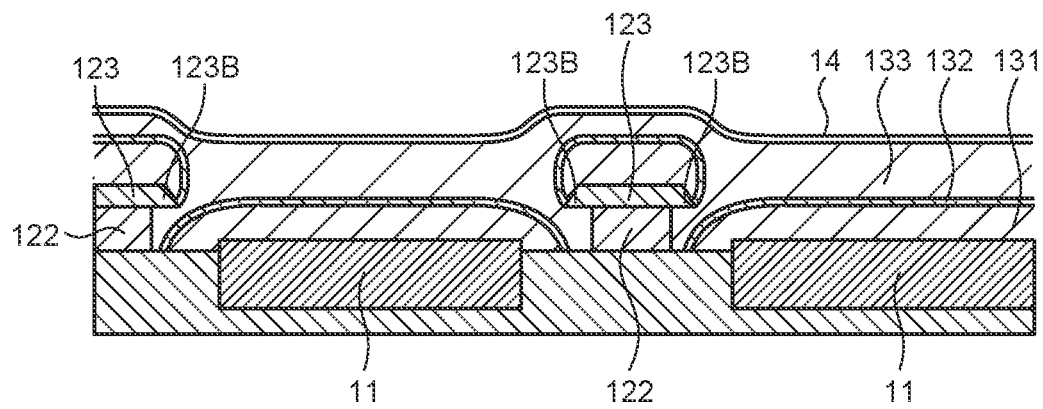
FIG. 13 is a cross-sectional view of a light-emitting element according to a sixth embodiment.

The light-emitting element 1 according to this embodiment is different from that according to the first example in that the lower insulating layer 121 is not provided. The light-emitting element 1 according to this embodiment has the same structure as that illustrated in FIG. 1, except for the lower insulating layer 121. FIG. 13 is a cross-sectional view of the light-emitting element according to the sixth embodiment.

In the light-emitting element 1 according to this embodiment, the lower insulating layer 121 is not disposed. In other words, a flat insulating layer is disposed between a side surface of the end or one anode electrode 11 and a side surface of the end or the anode electrode 11 adjacent thereto, without covering the surface near the ends of the anode electrodes 11.

The intermediate insulating layers 122 are disposed on the flat insulating layer covering between the adjacent anode electrodes 11, as illustrated in FIG. 12. The upper insulating layer 123 is disposed on a surface of each of the intermediate insulating layers 122, the surface being that on the side of the cathode electrode 14.

In this configuration, the first OLED layer 131 is cut between the anode electrode 11 and the upper insulating layer 123 adjacent thereto, due to the shadowing phenomenon achieved by the eave 123B of the upper insulating layer 123, during the organic vapor deposition process. In this configuration, the CGL 132, too, is cut between the anode electrode 11 and the upper insulating layer 123 adjacent thereto, due to the shadowing phenomenon achieved by the eave 123B, during the organic vapor deposition process.

The second OLED layer 133 is formed as a continuous layer without being cut between the pixels.

As described above, in the light-emitting element 1 according to this embodiment, the lower insulating layer 121 is not provided, and the intermediate insulating layer 122 and the upper insulating layer 123 are disposed between the adjacent anode electrodes 11. In this manner, even if the lower insulating layer 121 is not provided, as long as an eave structure is present on the side of the anode electrode 11, it is possible for the light-emitting element 1 to have the CGL 132 cut in units of an anode electrodes 11 (in units of a pixel). Therefore, the light-emitting element 1 according to this embodiment, too, can suppress the current leakage, suppress the excitation of and the light emission from the pixels other than that to which a current is applied, and improve the light emission properties.

Seventh Embodiment

Figure 14:
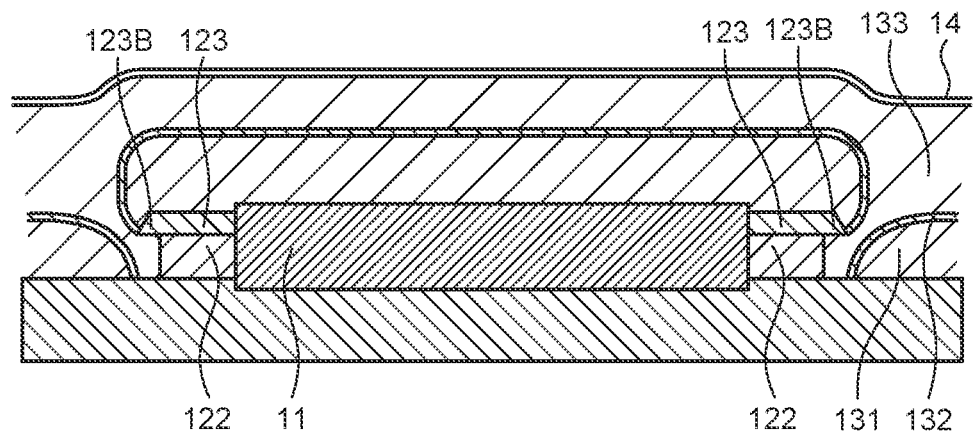
FIG. 14 is a cross-sectional view of a light-emitting element according to the seventh embodiment.

In the light-emitting element 1 according to this embodiment, the intermediate insulating layers 122 and the upper insulating layers 123 are disposed with the anode electrode 11 interposed therebetween. In the light-emitting element 1 according to this embodiment, the organic layer 13 has the same arrangement as that illustrated in 1. FIG. 14 is a cross-sectional view of the light-emitting element according to the seventh embodiment.

In the light-emitting element 1 according to this embodiment, the intermediate insulating layers 122 and the upper insulating layers 123 are disposed in close contact with respective side surfaces of the anode electrode 11, as illustrated in FIG. 14. The intermediate insulating layer 122 and the upper insulating layer 123 have an opening between the adjacent anode electrodes 11.

In this example, an end of the intermediate insulating layer 122, the end being that on the side of the opening is at a position further away from the center of the opening, than an end of the inner wall of the opening of the upper insulating layer 123, the end being an end on the side of the anode electrode 11. As a result, the eave 123B is formed on the outer side of the anode electrode 11, that is, toward the adjacent anode electrode 11.

In this configuration, the first OLED layer 131 is cut between the upper insulating layer 123 and the insulating layer covering between the anode electrode 11, due to the shadowing phenomenon achieved by the eave 123B, during the organic vapor deposition process. The CGL 132, too, is cut between the upper insulating layer 123 and the insulating layer covering between the anode electrode 11, due to the shadowing phenomenon achieved by the eave 123B, during the organic vapor deposition process.

The second OLED layer 133 is formed as a continuous layer without being cut between the pixels.

As described above, in the light-emitting element 1 according to this embodiment, the intermediate insulating layers 122 and the upper insulating layers 123 are disposed with the anode electrode 11 therebetween, and the eaves 123B are provided toward the outer side of the anode electrode 11. In this manner, even when the intermediate insulating layer 122 and the upper insulating layer 123 are disposed with the anode electrode 11 therebetween, it is possible for the light-emitting element 1 to have the CGL 132 cut in units of the anode electrodes 11 (in units of a pixel). Therefore, the light-emitting element 1 according to this embodiment, too, can suppress the current leakage, suppress the excitation of and the light emission from the pixels other than that to which a current is applied, and improve the light emission properties.

Some embodiments of the present disclosure have been explained above, but the technical scope of the present disclosure is not limited to the above-described embodiments as they are, and various modifications are still possible within the scope not deviating from the essence of the present disclosure. Furthermore, elements according to these different embodiments and modifications may be combined as appropriate.

It should be noted that the effects described herein are merely exemplary and are not limiting, and any other effects may be achieved.

This technology may also have the following configurations.

(1)

A light-emitting element comprising:
a plurality of first electrodes each of which is provided for a corresponding pixel;
an insulating layer that has an opening exposing corresponding one of the plurality of first electrodes to outside, and that has an eave in a middle of a thickness direction of an inner wall of the opening;
an organic layer that covers the opening, and that includes a charge generation layer cut by the eave of the insulating layer; and
a second electrode that is disposed on a surface of the organic layer, the surface being a surface on an opposite side of the first electrode.

(2)

The light-emitting element according to (1), wherein the eave has a tapered shape.

(3)

The light-emitting element according to (2), wherein a maximum thickness of the eave is thinner than a thickness of the inner wall, or a taper angle of the eave is equal to or smaller than a predetermined angle.

(4)

The light-emitting element according to any one of (1) to (3), wherein
the insulating layer includes the eave in plurality, and
the charge generation layer is provided in a same number as a number of the eaves, and each of the charge generation layers is cut by corresponding one of the eaves.

(5)

The light-emitting element according to (4), wherein the insulating layer includes the charge generation layer cut by an inclination of the inner wall.

(6)

The light-emitting element according to any one of (1) to (5), wherein an end of the eave, the end being an end on a side of the opening, is separated from an end of the insulating layer positioned nearer to the first electrode than, the eave by a predetermined distance in a direction away from a center of the opening, the end of the insulating layer being an end on the side of the opening.

(7)

The light-emitting element according to any one of (1) to (5), wherein an end of the eave, the end being an end on a side of the opening, is at a same distance from a center of the opening, as an end of the insulating layer positioned nearer to the first electrode than the eave, the end of the insulating layer being an end on the side of the opening.

(8)

The light-emitting element according to any one of (1) to (5), wherein an end of the eave, the end being an end on a side of the opening, is positioned nearer to a center of the opening, than an end of the insulating layer positioned nearer to the first electrode than the eave, the end being an end on the side of the opening.

(9)

The light-emitting element according to any one of (1) to (8), wherein a region of the insulating layer, the region being a region positioned near the first electrode than the eave, has a step-like shape.

(10)

The light-emitting element according to any one of (1) to (9), wherein a lower-end layer cutting eave is provided to an end of the insulating layer, the end being an end on a side of the first electrode in the thickness direction.

(11)

The light-emitting element according to any one of (1) to (10), wherein
the light-emitting element is provided in plurality, and
the eave is disposed in plurality between the light-emitting elements.

(12)

The light-emitting element according to any one of (1) to (10), wherein the first electrode has a sunken surface in the opening, the sunken surface being sunken toward a side opposite to an opening direction, in a region positioned nearer to the first electrode than the eave of the insulating layer.

(13)

The light-emitting element according to any one of (1) to (10), wherein the first electrode is interposed between the eaves in such a manner that the eaves face in directions away from the first electrode.

(14)

A display device comprising:
a substrate;
a plurality of first electrodes each of which is provided on the substrate for a corresponding pixel;
an insulating layer that has an opening exposing corresponding one of the plurality of first electrodes to outside, and that has an eave in a middle of a thickness direction of an inner wall of the opening;
an organic layer that covers the opening, and that includes a charge generation layer cut by the eave of the insulating layer;
a second electrode that is disposed on a surface of the organic layer, the surface being a surface on an opposite side of the first electrode; and
a color filter layer that is disposed on a surface of the second electrode, the surface being a surface on an opposite side of the organic layer.

REFERENCE SIGNS LIST

1 LIGHT-EMITTING ELEMENT
11 ANODE ELECTRODE
12 PIXEL-ISOLATING INSULATION FILM
13 ORGANIC LAYER
14 CATHODE ELECTRODE
121 LOWER INSULATING LAYER
121A INNER WALL
121B EAVE
122 INTERMEDIATE INSULATING LAYER
122A INNER WALL
123 UPPER INSULATING LAYER
123A INNER WALL
123B EAVE
131 FIRST OLED LAYER
132 CGL
133 SECOND OLED LAYER
P ORGANIC LAYER CUT PORTION
S SPACE

The invention claimed is:
1. A light-emitting element comprising:
a plurality of first electrodes, each of which is provided for a corresponding pixel;
an insulating layer that has an opening exposing corresponding to one of the first electrodes, the insulating layer including multiple layers stacked along a first direction, the multiple layers including a plurality of eaves that extend along a second direction perpendicular to the first direction towards the opening;

an organic layer that covers the opening; and a second electrode that is disposed on a surface of the organic layer, the surface being a surface on an opposite side of the one of the first electrodes.

2. The light-emitting element according to claim 1, wherein at least one of the eaves has a tapered shape.

3. The light-emitting element according to claim 2, wherein a maximum thickness of the eaves is thinner than a thickness of an inner wall of the opening, or a taper angle of the eaves is equal to or smaller than a predetermined angle.

4. The light-emitting element according to claim 1, wherein the organic layer includes a charge generating layer that is cut by one of the eaves.

5. The light-emitting element according to claim 4, wherein the charge generation layers are respectively cut by an inclination of an inner wall of the opening.

6. The light-emitting element according to claim 4, wherein the charge generating layer is one of a plurality of charge generating layers provided in a same number as a number of the eaves, and each of the charge generating layers is cut by a corresponding one of the eaves.

7. The light-emitting element according to claim 1, wherein an end of one of the eaves, the end being an end on a side of the opening, is separated from an end of the insulating layer positioned nearer to the first electrode than the one of the eaves by a predetermined distance in a direction away from a center of the opening, the end of the insulating layer being an end on the side of the opening.

8. The light-emitting element according to claim 1, wherein an end of one of the eaves, the end being an end on a side of the opening, is at a same distance from a center of the opening, as an end of the insulating layer positioned nearer to the first electrode than the one of the eaves, the end of the insulating layer being an end on the side of the opening.

9. The light-emitting element according to claim 1, wherein an end of one of the eaves, the end being an end on a side of the opening, is positioned nearer to a center of the opening, than an end of the insulating layer positioned nearer to the first electrode than the one of the eaves, the end being an end on the side of the opening.

10. The light-emitting element according to claim 1, wherein a region of the insulating layer, the region being a region positioned nearer to the first electrode than one of the eaves, has a step-like shape.

11. The light-emitting element according to claim 1, wherein a lower-end layer cutting one of the eaves is provided to an end of the insulating layer, the end being an end on a side of the first electrode in a thickness direction of an inner wall of the opening.

12. The light-emitting element according to claim 1, wherein the first electrode has a sunken surface in the opening, the sunken surface being sunken toward a side opposite to an opening direction, in a region positioned nearer to the first electrode than at least one of the eaves.

13. The light-emitting element according to claim 1, wherein the first electrode is interposed between the eaves in such a manner that the eaves face in directions away from the first electrode.

14. A display device comprising:
a substrate;
a plurality of first electrodes, each of which is provided on the substrate for a corresponding pixel;

an insulating layer that has an opening exposing corresponding to one of the first electrodes, the insulating layer including multiple layers stacked along a first direction, the multiple layers including a plurality of eaves that extend along a second direction perpendicular to the first direction towards the opening;

an organic layer that covers the opening;

a second electrode that is disposed on a surface of the organic layer, the surface being a surface on an opposite side of the one of the first electrodes; and a color filter layer that is disposed above a surface of the second electrode, the surface being a surface on an opposite side of the organic layer.

15. The display device according to claim 14, wherein at least one of the eaves has a tapered shape.

16. The display device according to claim 15, wherein a maximum thickness of the eaves is thinner than a thickness of an inner wall of the opening, or a taper angle of the eaves is equal to or smaller than a predetermined angle.

17. The display device according to claim 14 wherein the organic layer includes a charge generating layer that is cut by one of the eaves.

18. The display device according to claim 17, wherein the charge generation layers are respectively cut by an inclination of an inner wall of the opening.

19. The display device according to claim 17, wherein the charge generating layer is one of a plurality of charge generating layers provided in a same number as a number of the eaves, and each of the charge generating layers is cut by a corresponding one of the eaves.

20. The display device according to claim 14, wherein an end of one of the eaves, the end being an end on a side of the opening, is separated from an end of the insulating layer positioned nearer to the first electrode than the one of the eaves by a predetermined distance in a direction away from a center of the opening, the end of the insulating layer being an end on the side of the opening.

21. The display device according to claim 14, wherein an end of one of the eaves, the end being an end on a side of the opening, is at a same distance from a center of the opening, as an end of the insulating layer positioned nearer to the first electrode than the one of the eaves, the end of the insulating layer being an end on the side of the opening.

22. The display device according to claim 14, wherein an end of one of the eaves, the end being an end on a side of the opening, is positioned nearer to a center of the opening, than an end of the insulating layer positioned nearer to the first electrode than the one of the eaves, the end being an end on the side of the opening.

23. The display device according to claim 14, wherein a region of the insulating layer, the region being a region positioned nearer to the first electrode than one of the eaves, has a step-like shape.

24. The display device according to claim 14, wherein a lower-end layer cutting one of the eaves is provided to an end of the insulating layer, the end being an end on a side of the first electrode in a thickness direction of an inner wall of the opening.

25. The display device according to claim 14, wherein the first electrode has a sunken surface in the opening, the sunken surface being sunken toward a side opposite to an opening direction, in a region positioned nearer to the first electrode than at least one of the eaves.

26. The display device according to claim 14, wherein the first electrode is interposed between the eaves in such a manner that the eaves face in directions away from the first electrode.

* * * * *